United States Patent [19]

Trahan et al.

[11] Patent Number: 5,436,802
[45] Date of Patent: Jul. 25, 1995

[54] METHOD AND APPARATUS FOR SHIELDING AN ELECTRICAL CIRCUIT THAT IS DISPOSED ON A SUBSTRATE

[75] Inventors: David W. Trahan, Grayslake; Michael L. Charlier, Arlington Heights; Keith A. Gronczewski, Des Plaines, all of Ill.

[73] Assignee: Motorola, Schaumburg, Ill.

[21] Appl. No.: 213,652

[22] Filed: Mar. 16, 1994

[51] Int. Cl.⁶ ............................................. H05K 9/00
[52] U.S. Cl. .................................. 361/816; 361/792; 361/800; 174/35 R
[58] Field of Search ............... 361/752, 790, 792, 796, 361/800, 801, 810, 816, 818; 174/35 R, 17 R, 35 TS; 257/678, 686

[56] References Cited

U.S. PATENT DOCUMENTS

| | | |
|---|---|---|
| 4,829,432 | 5/1989 | Hershberger et al. ............. 361/424 |
| 4,890,199 | 12/1989 | Beutler . |
| 5,206,796 | 4/1993 | Thompson et al. ................. 361/424 |

*Primary Examiner*—Leo P. Picard
*Assistant Examiner*—Young Whang
*Attorney, Agent, or Firm*—Daniel C. Crilly

[57] ABSTRACT

An electronic device employs a method and apparatus for shielding an electrical circuit (101) that is disposed on a substrate (120). A base member (103) that includes a top portion (104) and a plurality of side portions (105) is electrically coupled to a receptacle area (121) of the substrate (120) such that the plurality of side portions (105) substantially encircle the electrical circuit (101). The top portion (104) of the base member (103) includes a plurality of tab members (108) interposed with a plurality of receptacle openings (109). A substantially planar cover (102) that includes a plurality of protrusions (111) is positioned adjacent to the top portion (104) of the base member (103) such that each protrusion (111) is positioned within a corresponding receptacle opening (109). The cover (102) is then urged until each protrusion (111) interlocks with a corresponding tab member (108) to substantially enclose and, thus, shield the electrical circuit (101).

5 Claims, 2 Drawing Sheets

METHOD AND APPARATUS FOR SHIELDING AN ELECTRICAL CIRCUIT THAT IS DISPOSED ON A SUBSTRATE

FIELD OF THE INVENTION

This invention relates generally to electromagnetic shielding assemblies and, in particular, to a method and apparatus for shielding an electrical circuit that is disposed on a substrate.

BACKGROUND OF THE INVENTION

Radios, computers, and other electronic equipment often generate electromagnetic signals in one portion of the electronic equipment which may radiate to and interfere with another portion of the electronic equipment. To minimize this interference effect, electrically conducting (and sometimes magnetically conducting) material is interposed between the two portions of the electronic circuitry. This shielding may take the form of a wall or a complete enclosure and may be placed around the portion of the electronic circuit generating the electromagnetic signal and/or may be placed around the portion of the electronic circuit which is susceptible to the electromagnetic signal.

Existing electromagnetic shields are typically formed from a sheet of metallic material having a plate member suitable for positioning above a circuit component element (or entire circuit), and includes side flange portions extending downwardly therefrom to cover side portions of the circuit component element. In order to function properly, the shield must be electrically coupled to the electrical circuit over which the shield is positioned. Therefore, one-piece shields are usually soldered to the electronic circuit in a position where it will perform a shielding function; unfortunately, such a permanent attachment is difficult to remove if the need for service arises.

To avoid permanent attachment, other electromagnetic shielding efforts include multiple components utilizing spring fingers and spring-like flanges to produce contact with one another. In order for these shields to function optimally, multiple contact points between shield components must be maintained. "U"-shaped double cantilever spring channels, like those disclosed in U.S. Pat. No. 4,890,199, allow both removable shields or raised areas of the housing to clip into the spring channels; however, additional circuit board area is required to employ the numerous channels that retain the removable shield or raised housing area. Another variation includes shields having removeable lids with angled spring-like flanges that allow tight attachment to walls extending from the circuit board. Although removeable, the flanges must be lengthy and the walls high in order to permit secure attachment. Circuit boards having electromagnetic shield assemblies of this type require an increase in the volume of the chassis housing the circuit board.

Thus, miniaturized electronic devices place even greater constraints on shielding, first, because the electronic circuits are closer together, and second, the physical room available for shielding is greatly reduced. The techniques for attaching or surrounding the electronic circuit by the shielding must consume as little space as possible while providing secure, easily manufactured, and easily repairable interconnections.

Therefore, a need exists for a method and apparatus for shielding an electrical circuit that emits, or is sensitive to, electromagnetic energy while requiring significantly less height than assemblies of the prior art and while facilitating easy access to the electrical circuit when necessary.

DESCRIPTION OF A PREFERRED EMBODIMENT

The present invention provides a method and apparatus for shielding an electrical circuit that is disposed on a substrate. A base member that includes a top portion and a plurality of side portions is electrically coupled to a receptacle area of the substrate such that the plurality of side portions substantially encircle the electrical circuit. The top portion of the base member includes a plurality of tab members interposed with a plurality of receptacle openings. A substantially planar cover that includes a plurality of protrusions is positioned adjacent to the top portion of the base member such that each protrusion is positioned within a corresponding receptacle opening. The cover is then urged until each protrusion interlocks with a corresponding tab member to substantially enclose and, thus, shield the electrical circuit. By shielding the electrical circuit in this manner, the present invention facilitates electromagnetic shielding while permitting a low profile enclosure, as compared to electromagnetic shielding techniques of the prior art.

Figure 1:
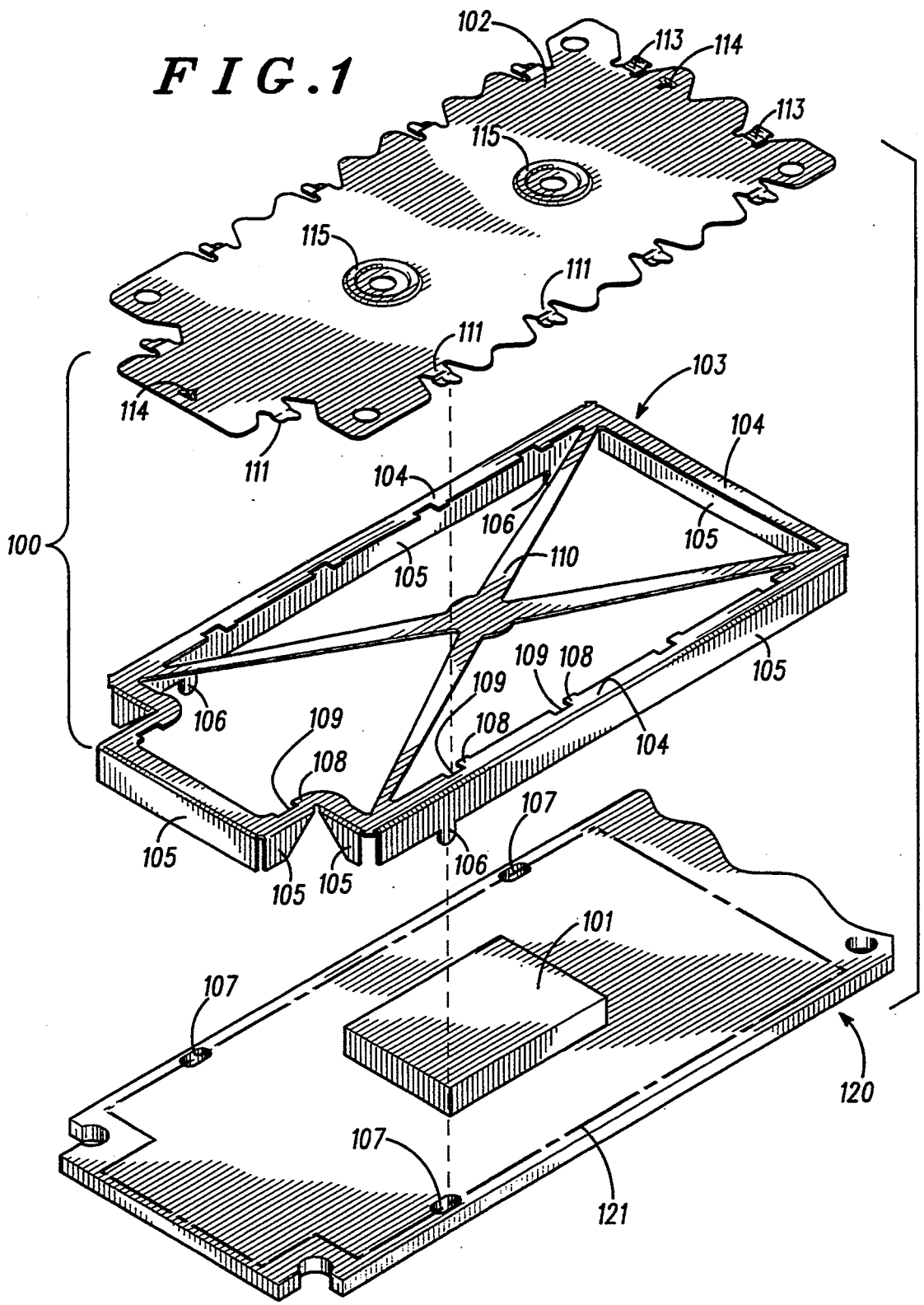
FIG. 1 illustrates an exploded perspective view of an electromagnetic shield assembly that is to be positioned upon a substrate in accordance with the present invention.

The present invention can be more fully described with reference to FIGS. 1–4. FIG. 1 illustrates an exploded perspective view of an electromagnetic shielding assembly 100 that is to be positioned upon a substrate 120 in accordance with the present invention. The electromagnetic shielding assembly 100 includes a base member 103 and a substantially planar cover 102. The cover 102 includes a plurality of protrusions 111 located at predetermined locations about a periphery of the cover 102 and extending outwardly therefrom. In a preferred embodiment, the protrusions 111 are integrally disposed within the cover 102 and are distally separated by approximately one-eighth wavelength or less at the highest frequency for which shielding is necessary. However, in an alternate embodiment, the protrusions 111 might be welded to the cover 102. In the preferred embodiment, the cover 102 further includes integrally disposed serpentine clips 113 and locking tabs 114 to securely attach the cover 102 to the base member 103 upon assembly of the electromagnetic shielding assembly 100.

The base member 103 includes a top portion 104 and a plurality of side portions 105. The top portion 104 includes a plurality of tab members 108 interposed with a plurality of receptacle openings 109 that are located about a periphery of the top portion 104. In a preferred embodiment, the top portion 104 further includes a support member 110 that mechanically supports the cover 102 during assembly of the electromagnetic shielding assembly 100.

The cover 102 and the base member 103 preferably comprise a common metallic material to minimize corrosion after assembly. In a preferred embodiment, the cover 102 and the base member 103 are fabricated, using a known progressive stamping technique, from a 0.2 mm thick sheet of a nickel-silver alloy. The side portions 105 of the base member 103 are then folded into position, such that the side portions 105 extend downwardly from the top portion 104 to form the walls of the electromagnetic shielding assembly 100. The side portions 105 are of a predetermined height based on the maximum height of an electrical circuit 101 that is to be shielded by electromagnetic shield assembly 100. Depending on the type of circuit 101, the height of the side portions 105 might be less than 4.0 millimeters.

As is also shown in FIG. 1, the electromagnetic shielding assembly 100, once assembled and attached to the substrate 120, is used to shield an electrical circuit 101 that is disposed on the substrate 120. The electrical circuit 101 might be any circuit that emits, or is sensitive to, electromagnetic energy-for example, an oscillator circuit, a microstrip transmission line, or digital logic circuitry. The substrate 120 preferably comprises a printed circuit board material, such as polyimide, FR4, or cyanate ester. In a preferred embodiment, the substrate 120 and the electrical circuit 101 reside within an electronic device, such as a portable radiotelephone.

The electromagnetic shielding assembly 100 is assembled and attached to a substrate 120 such that the assembled electromagnetic shielding assembly substantially encloses the electrical circuit 101. In a preferred embodiment, the side portions 105 of the base member 103 include locating tabs 106 that fit into corresponding alignment holes 107 of the substrate 120. The locating tabs 106 are positioned within the alignment holes 107 such that the side portions 105 of the base member 103 rest upon a receptacle area 121 of the substrate 120. The receptacle area 121 preferably comprises a copper trace that is electrically coupled to a ground plane (not shown) via plated throughholes (not shown). The receptacle area 121 has a geometric shape similar to that of the base member 103 and substantially encircles the circuit 101 that is to be shielded by the electromagnetic shielding assembly 100. The side portions 105 are electrically coupled to the receptacle area 121 via solder or conductive epoxy.

Once the base member 103 is attached to the substrate 120, the cover 102 is conjoined with the base member 103 to substantially enclose the circuit 101. The cover 102 is positioned above, and substantially adjacent to, the top portion 104 of the base member 103 such that each protrusion 111 is positioned within a respective receptacle opening 109 of the top portion 104. The cover 102 is then urged, preferably by a sliding motion, until the protrusions 111 interlock with the tab members 108 and the serpentine clips 113 interlock with the top portion 104. The support member 110 guides the cover 102 during the sliding operation to facilitate sufficient interlocking and to prevent the cover 102 from contacting any components of the electrical circuit 101. To further assist with the sliding operation, the cover 102 might also include finger embosses 115 to prevent slippage of an assembler's fingers during assembly. Each finger emboss 115 preferably comprises a raised circular ridge approximately 6.0 millimeters in diameter that extends upwardly the planar surface of cover 102. Upon completing the sliding motion, the locking tabs 114 prevent the cover 102 from being removed—for example, due to vibration-by limiting the post-assembled movement of the cover 102 to within the confines of the base member 103 as defined by the geometric shape of the top portion 104.

Figure 2:
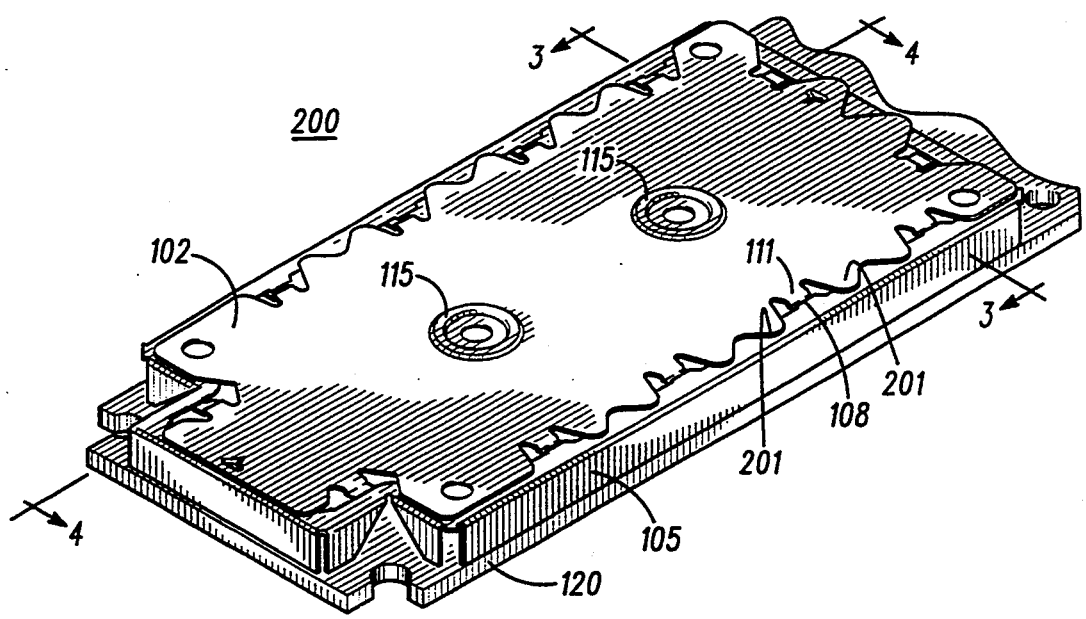
FIG. 2 illustrates a perspective view of an assembled electromagnetic shielding assembly that is positioned upon a substrate in accordance with the present invention.

FIG. 2 illustrates a perspective view of an assembled electromagnetic shielding assembly 200 that is positioned upon the substrate 120 in accordance with the present invention. As detailed above, the assembled electromagnetic shielding assembly 200 includes the cover 102 conjoined with the base member 103, such that the cover 102 and the base member's top portion 104 and side portions 105 enclose the electrical circuit (not shown). As shown in FIG. 2, each tab member 108 of the base member's top portion 104 is interlocked with the each protrusion 111 of the cover 102 to provide an area of electrical connectivity between the cover 102 and the base member 103. In addition to this area of electrical contact, the cover 102 contacts the top portion 104 of the base member 103 in at least two other contact areas 201 due to a downward normal force exerted on the cover 102 by the connections of the protrusions 111 and the tab members 108. At least one of the two areas 201 is located on each side of the connection between a protrusion 111 and a tab member 108 as depicted in FIG. 2. In a similar manner, at least three electrical contact areas also exist at the locations where the serpentine clips 113 interlock with the top portion 104 of the base member 103. Thus, the fully assembled electromagnetic shielding assembly 200 provides a multiplicity of electrical contact points where the cover 102 is conjoined with the base member 103, thereby enhancing the shielding effectiveness of the assembled electromagnetic shielding assembly 200.

Figure 3:
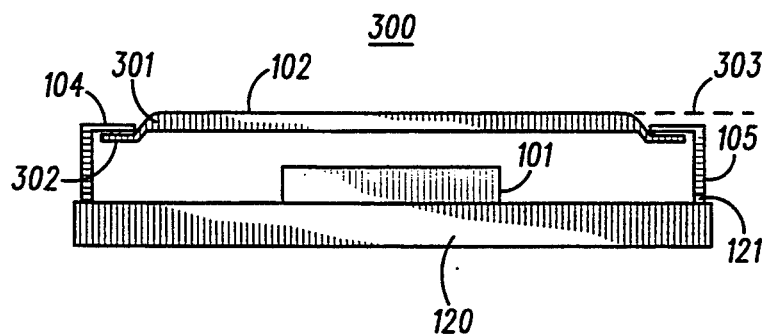
FIG. 3 illustrates a cross-sectional view of the assembled electromagnetic shielding assembly along the 3—3 line of FIG. 2.

FIG. 3 illustrates a cross-sectional view 300 of the assembled electromagnetic shielding assembly 200 along the 3—3 line of FIG. 2. As shown, the cover 102 lies substantially along a plane 303. As is also shown, the assembled electromagnetic shielding assembly 200 surrounds the electrical circuit 101 by providing a continuous electrical connection between the receptacle area 121 of the substrate 120, the top and side portions 104, 105 of the base member 103, and the cover 102. The interlock connection between the cover 102 and the base member occurs, as mentioned above, where each protrusion 111 contacts a corresponding tab member 108. In a preferred embodiment, each protrusion 111 preferably comprises an angled portion 301 and a planar portion 302. The angled portion 301 extends outwardly from the cover 102 at an angle (e.g., 45 degrees) with respect to the plane 303, such that the angled portion 301 resides below the plane 303. The planar portion 302 extends outwardly from the angled portion 301 and is substantially parallel to the plane 303. Thus, upon conjoinment of the cover 102 with the base member 103, each planar portion 302 contacts the underside of a corresponding tab member 108.

Figure 4:
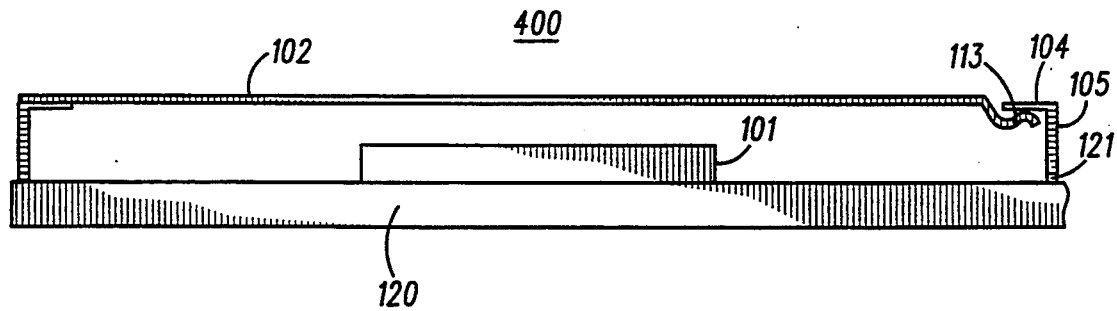
FIG. 4 illustrates a cross-sectional view of the assembled electromagnetic shielding assembly along the 4—4 line of FIG. 2.

FIG. 4 illustrates a cross-sectional view 400 of the assembled electromagnetic shielding assembly 200 along the 4—4 line of FIG. 2. As depicted in this view 400, each serpentine clip 113 contacts the underside of the top portion 104 upon assembly of the cover 102 and the base member 103.

The present invention provides a a method and apparatus for shielding an electrical circuit that is disposed on a substrate. With this invention, the electrical circuit is sufficiently shielded while the shielding enclosure maintains a low profile and requires a reduced substrate area, as compared to prior art shielding techniques. Further, the present invention facilitates easy access to the electrical circuit in the event that service is necessary. Access can be obtained by simply lifting the locating tabs in the cover and reversing the order of the assembly steps disclosed above, in contrast to requiring the unsoldering of single-piece shields as in the prior art.

What is claimed is:

1. An electromagnetic shielding assembly that provides electromagnetic shielding of an electrical circuit that is disposed upon a substrate, the electromagnetic shielding assembly comprising:

a base member having a top portion and a plurality of side portions, wherein each of the plurality of side portions has a predetermined height and extends downwardly from the top portion, wherein the top portion includes a plurality of integrally disposed tab members interposed with a plurality of receptacle openings located about a periphery of the top portion and wherein the plurality of side portions are electrically coupled to a receptacle area of the substrate such that the plurality of side portions substantially encircle the electrical circuit; and a substantially planar cover lying substantially along a first plane, wherein the substantially planar cover includes a plurality of protrusions that are located at predetermined locations about a periphery of the substantially planar cover and wherein each of the plurality of protrusions extend outwardly from the substantially planar cover and reside below the first plane, and wherein the plurality of protrusions interlock with the plurality of tab members such that the electrical circuit is substantially enclosed by the substantially planar cover, the top portion, and the plurality of side portions.

2. The electromagnetic shielding assembly of claim 1, wherein each of the plurality of protrusions comprises a first portion and a second portion, wherein the first portion extends outwardly from the substantially planar cover at an angle with respect to the first plane, such that the first portion resides below the first plane, and wherein the second portion extends outwardly from the first portion and is substantially parallel to the first plane.

3. The electromagnetic shielding assembly of claim 1, wherein the substantially planar cover further comprises at least one integrally disposed serpentine clip that interlocks with the top portion.

4. The electromagnetic shielding assembly of claim 1, wherein the top portion further comprises a support member.

5. A method of shielding an electrical circuit that is disposed on a substrate, the method comprising the steps of:

a) providing a base member that includes a top portion and a plurality of side portions, wherein each of the plurality of side portions has a predetermined height and extends downwardly from the top portion, wherein the top portion includes a plurality of integrally disposed tab members interposed with a plurality of receptacle openings located about a periphery of the top portion, and wherein the plurality of tab members are positioned substantially orthogonal to the plurality of sides;

b) coupling the plurality of side portions to a receptacle area of the substrate, wherein the receptacle area substantially encircles the electrical circuit;

c) providing a substantially planar cover lying substantially along a first plane, wherein the substantially planar cover includes a plurality of protrusions that are located at predetermined locations about a periphery of the substantially planar cover and wherein each of the plurality of protrusions extend outwardly from the substantially planar cover and reside below the first plane;

d) positioning the substantially planar cover adjacent to the top portion of the base member such that each of the plurality of protrusions is positioned within a corresponding one of the plurality of receptacle openings; and e) urging the substantially planar cover such that each of the plurality of protrusions interlocks with a corresponding one of the plurality of tab members, thereby shielding the electrical circuit.

* * * * *